United States Patent
Setty et al.

(10) Patent No.: US 6,215,331 B1
(45) Date of Patent: Apr. 10, 2001

(54) METHOD AND APPARATUS FOR SEPARATELY CONTROLLING THE SENSING AND RESET PHASES OF A SENSE AMP/REGENERATIVE LATCH

(75) Inventors: Palaksha A. Setty, Sunnyvale, CA (US); Angelo R. Mastrocola, West Lawn, PA (US)

(73) Assignee: Agere Systems Inc., Berkeley Heights, NJ (US)

( * ) Notice: Subject to any disclaimer, the term of this patent is extended or adjusted under 35 U.S.C. 154(b) by 0 days.

(21) Appl. No.: 09/017,174

(22) Filed: Feb. 2, 1998

(51) Int. Cl.[7] ............................................. G11C 7/06
(52) U.S. Cl. ............................. 327/51; 327/52; 327/57
(58) Field of Search ............................ 327/51–57, 65, 327/89

(56) References Cited

U.S. PATENT DOCUMENTS

| 5,032,744 | 7/1991 | Liu | 307/491 |
| 5,055,720 | * 10/1991 | Tiede | 327/53 |
| 5,699,305 | * 12/1997 | Kawashima | 327/51 |
| 5,854,562 | * 12/1998 | Toyoshima et al. | 327/55 |

OTHER PUBLICATIONS

Page 761 of *Analysis and Design of Analog Integrated Circuits*, Second Edition, P.R. Gray and R.G. Meyer (John Wiley & Sons 1984).

* cited by examiner

Primary Examiner—Tuan T. Lam
(74) Attorney, Agent, or Firm—Synnestvedt & Lechner LLP

(57) ABSTRACT

In a sense amp/latch, the reset/sense phase of the sense amp/latch is separated into two separately controllable operations. By separating the reset/sense phase into two separately controllable operations, the parameters associated with optimization (speed and/or completeness of reset vs. larger gain during sensing) are substantially independent of each other and therefore do not conflict with each other. The separation of the reset/sense phase into two separately controllable operations is accomplished by setting a load impedance of the sense amp/latch to a first level during a reset phase, to a second level during a sensing phase, and to a third level during a latching phase.

20 Claims, 6 Drawing Sheets

METHOD AND APPARATUS FOR SEPARATELY CONTROLLING THE SENSING AND RESET PHASES OF A SENSE AMP/REGENERATIVE LATCH

BACKGROUND OF THE INVENTION

Analog comparators are fundamental building blocks of analog-to-digital converters (ADC's). Analog comparators often consist of two circuit blocks: a differential amplifier that amplifies the difference between a reference voltage and an analog input voltage, and a sense amplifier/regenerative latch (sense amp/latch). The sense amp/latch senses the amplified difference between the reference voltage and the analog input voltage and converts that difference into a digital 1 or a 0, based on whether the amplified voltage difference is positive or negative. FIG. 1A illustrates an example of a prior art comparator 100. Comparator 100 includes differential amplifier 102 and sense amp/latch 104. An input voltage $V_{in}$ and a reference voltage $V_{ref}$ are compared by comparator 100, and complementary outputs Q and $\overline{Q}$ are produced to indicate which input ($V_{in}$ or $V_{ref}$) is higher.

A commonly used topology for a sense amp/latch 104 is shown in FIG. 1B. In FIG. 1B, transistors $M_{IP}$ and $M_{IN}$ comprise an input differential pair that accepts the positive ($V_P$) and negative ($V_N$) voltage outputs, respectively, from the amplifier 102 shown in FIG. 1A. Transistors M1 through M4 comprise a cross-coupled inverter pair that creates regenerative feedback in a well-known manner when device MS is opened and device MP is closed. The circuit of FIG. 1B accepts a differential input and produces a differential output. Optimally $M_{IP}$, M3 and M1 should be matched in terms of their physical and electrical characteristics to their counterparts on the other half of the circuit ($M_{IN}$, M4 and M2).

The conventional sense amp/latch 104 has two phases of operation: a combined reset/sense phase (a negative feedback mode) and a latching phase (a positive feedback mode). A representative scheme for driving a comparator that uses the sense amp/regenerative latch of FIG. 1B is shown in FIG. 2. Throughout this application and the accompanying drawing figures, the terms Q and $\overline{Q}$, QR and $\overline{QR}$, LATCH and $\overline{LATCH}$, SENSE and $\overline{SENSE}$, and the like are digital complements of each other, e.g., when LATCH is a digital 1, $\overline{LATCH}$ is a digital 0 (and vice versa).

Referring to FIGS. 1B and 2, during the combined reset/sense phase $\overline{LATCH}$ is high, device MS is closed, and device MP is opened; as a result, transistors M3 and M4 are electrically isolated from the power supply ($V_{DD}$) and device MS brings nodes N1 and N2 substantially close to their common-mode voltage level (which is equal to the average gate-source voltages of M1 and M2) from their previous voltages (e.g., previous logic states) quickly. The combination of MS, M1 and M2 forms a differential load to the differential pair $M_{IP}$ and $M_{IN}$, and the sense amp/latch 104 behaves like a differential amplifier in this mode. Thus, given enough time, nodes N2 and N1 develop a voltage between them of A* ($V_P$–$V_N$) where A is the gain of sense amp/latch 104 when it is behaving like a differential amplifier.

FIG. 3 shows an equivalent circuit to the circuit of FIG. 1B when it is operating in the latching phase. During the latching phase, $\overline{LATCH}$ is low, device MP is closed, and device MS is opened. As a consequence, the sources of devices M3 and M4 are electrically connected to the power supply ($V_{DD}$) via device MP and the combination of transistors M1 through M4 operate as two back-to-back connected inverters and enable positive regenerative feedback (see FIG. 1B). The positive feedback causes the voltages on nodes N1 and N2 to change rapidly in opposite directions until the voltage on node N1 gets close to the supply rail ($V_{DD}$) and the voltage on node N2 gets close to the ground rail, or vice versa, depending on the initial voltages on node N1 and node N2.

In the circuit of FIG. 1B, the single device MS affects both the reset and sensing operation of the combined reset/sense phase, and the optimization of device MS is important for a fast reset and latch operation. However, the sizing of device MS is determined by two conflicting requirements: the conductance of device MS needs to be large enough to reset the circuit quickly, so that previous latched decisions will have no influence on the current decision (no memory), yet small enough such that large voltage gain from the input differential signal ($V_P$–$V_N$) to the differential signal of nodes N2 and N1 ($V_{N2}$–$V_{N1}$) occurs. Larger gain during the sensing operation provides a larger output to the latch; this results in faster latching and a smaller required input voltage to overcome the latch output offset. This is accomplished by selecting a size and control terminal voltage for device MS such that the conductance imposed by MS barely overcomes the negative conductance imposed by devices M1 and M2, so that the small signal conductance (inverse of the load resistance) formed substantially by the combination of M1, M2, and MS is small and positive. The two conflicting requirements (fast reset and large gain) limit the speed with which reset and latching can be performed for the circuit shown in FIG. 1B.

SUMMARY OF THE INVENTION

The present invention relates to the design of a high speed sense amp/latch. More particularly, the present invention separates the reset/sense phase of the sense amp/latch into two separately controllable operations. By separating the reset/sense phase into two separately controllable operations, the parameters associated with optimization (speed and/or completeness of reset vs. larger gain during sensing) are substantially independent of each other and therefore do not conflict with each other.

The separation of the reset/sense phase into two separately controllable operations is accomplished by setting a load impedance of the sense amp/latch to a first level during a reset phase, to a second level during a sensing phase, and to a third level during a latching phase.

In a first embodiment, a load impedance is controlled by applying a three-level voltage to the control terminal of a transistor (e.g. the gate of an MOS device), setting the load impedance in each of the three phases of operation (reset, sense, and latch) to three different levels, respectively.

In a preferred embodiment, two separate devices are used for controlling a load impedance of a sense amp/latch during the three phases of operation.

DETAILED DESCRIPTION OF THE PREFERRED EMBODIMENT

Figure 1A:
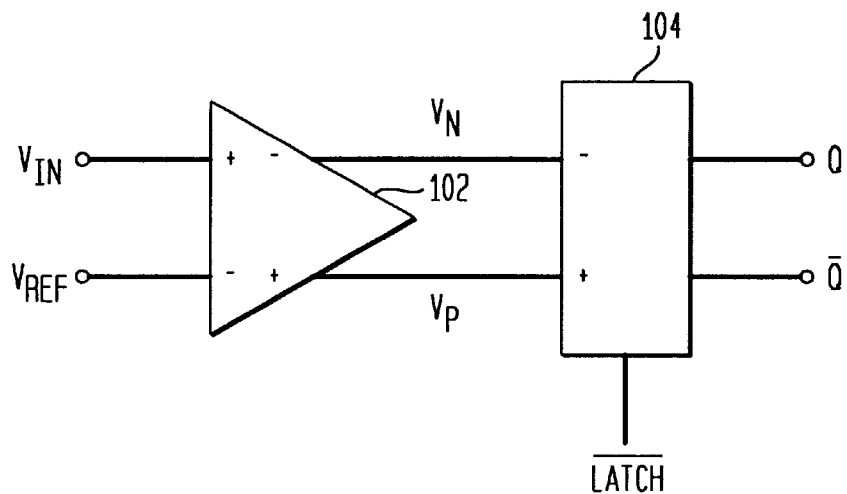
FIG. 1A is a block diagram of a prior art comparator.
Figure 1B:
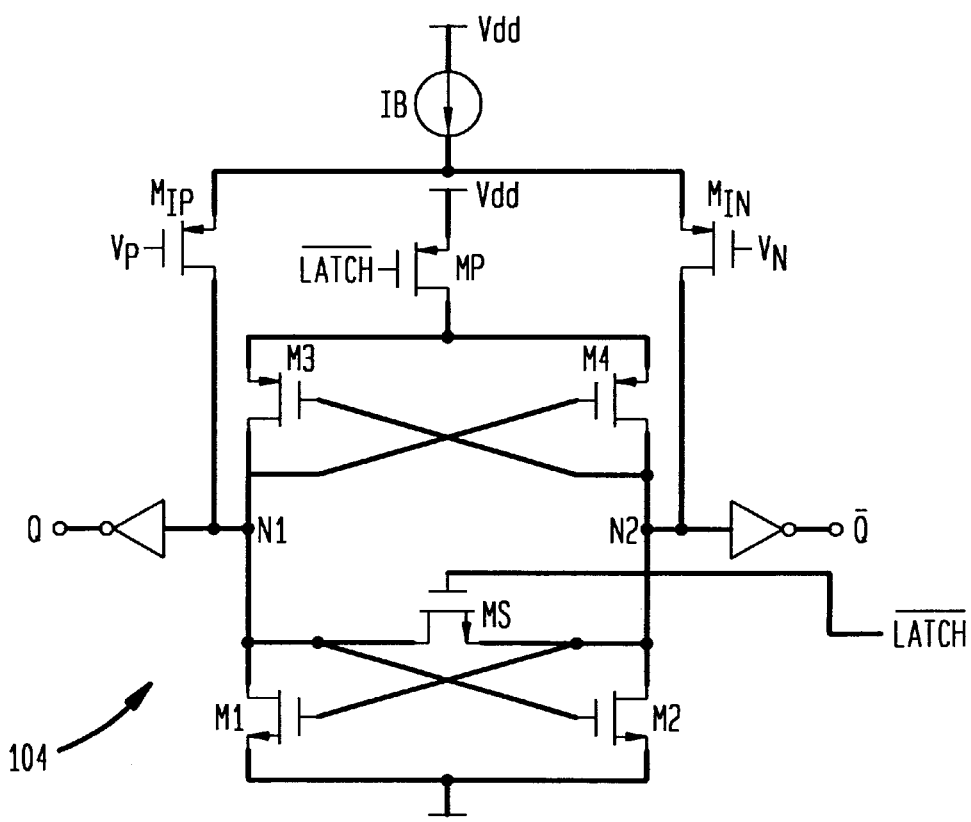
FIG. 1B is a circuit diagram of a prior art topology for a sense amp/latch.
Figure 2:
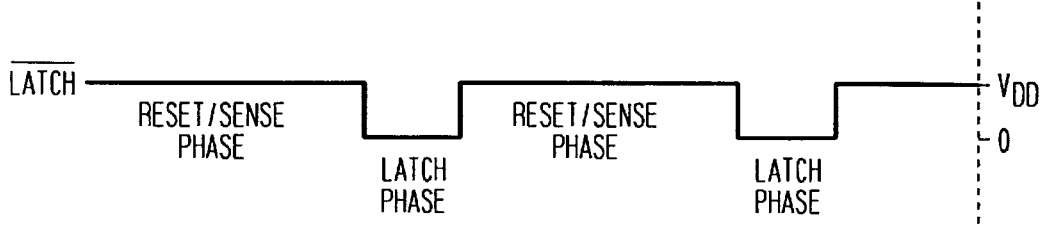
FIG. 2 is timing drawing for a comparator using the sense amp/latch of FIG. 1B.
Figure 3:
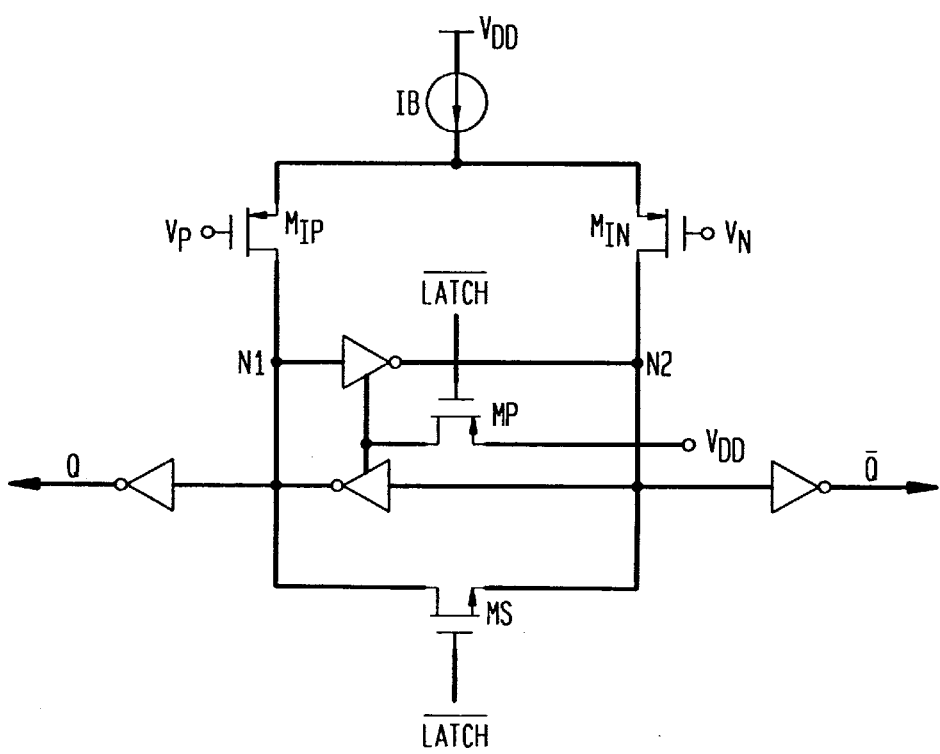
FIG. 3 is an equivalent circuit to the circuit of FIG. 1B when operating in the latching phase.
Figure 4:
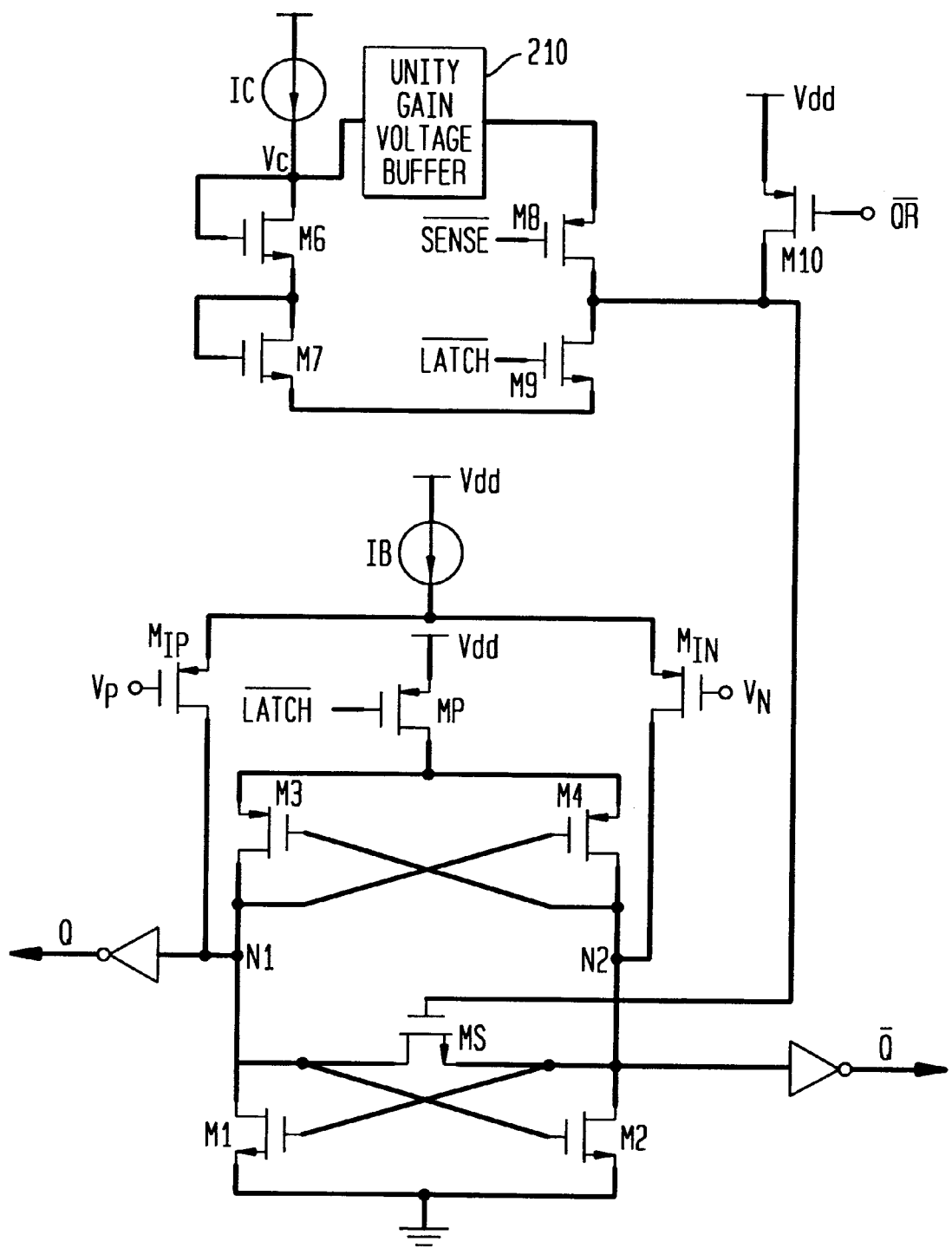
FIG. 4 is a circuit diagram of a first embodiment of the present invention.
Figure 4A:
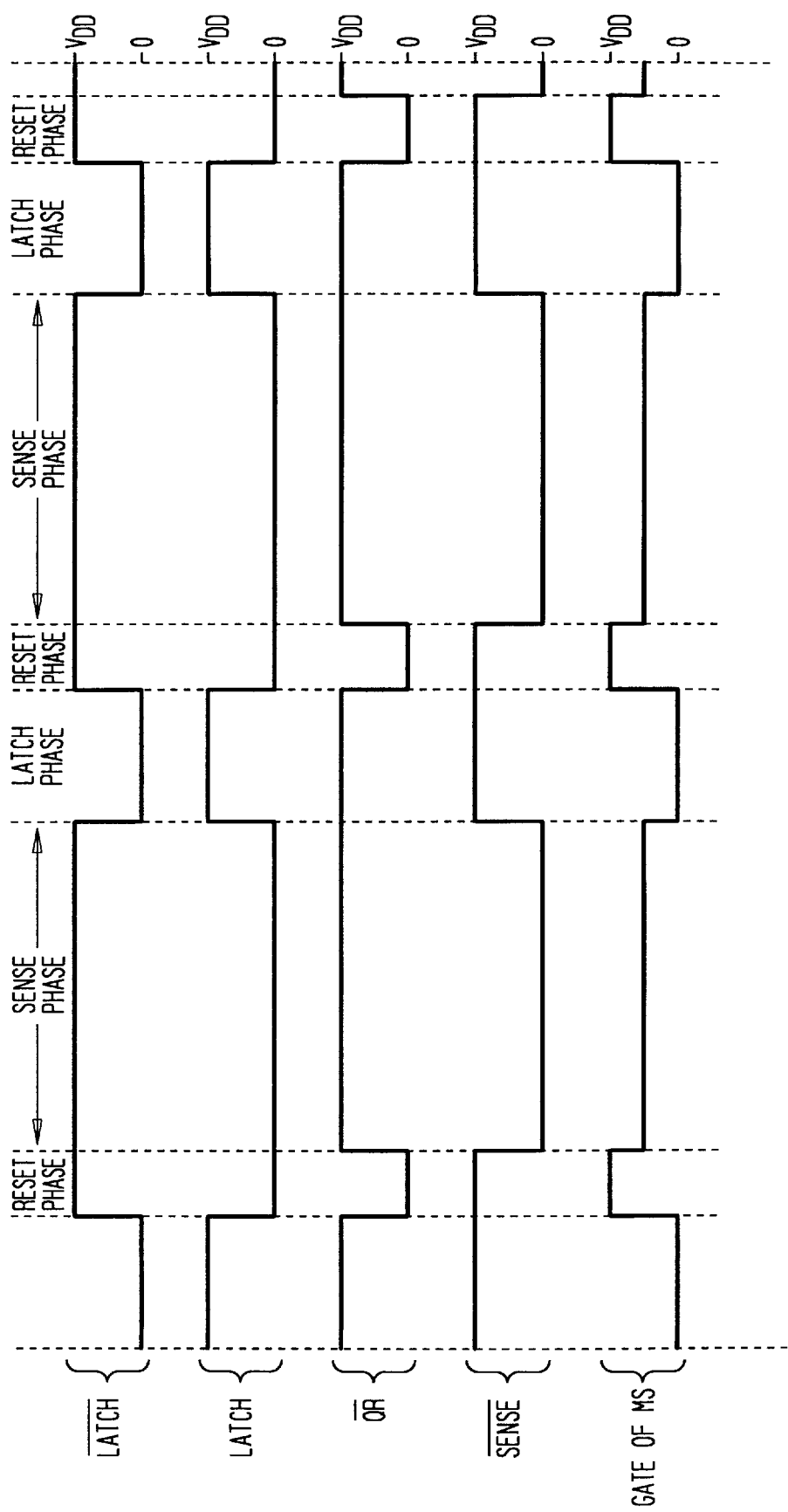
FIG. 4A is a timing drawing for the embodiment of FIG. 4.

A first embodiment for achieving both quick reset and large gain during the sensing phase is shown in FIG. 4. In this embodiment, a single device, MS, is used to achieve both a quick reset and a large gain; the reset/sense phase is broken down into two distinct phases by applying two different control terminal voltages to switch MS. During the quick reset phase, a voltage which greatly increases the conductance of MS (e.g., the supply voltage $V_{DD}$ for an NMOS device) is applied to the control terminal of device MS via device M10. This increases the conductance of switch MS, resulting in faster resetting of nodes N1 and N2. Then, during the sensing phase, the control signal at the control terminal of device MS is switched to a controlled value $V_C$ to achieve sufficiently large gain. This is accomplished by turning device M10 off, turning M8 on, and leaving device M9 off. Doing so directs controlled voltage $V_C$ to the control terminal of MS. As a result, differential gain during the sensing phase and quick reset during the quick reset phase is optimized. FIG. 4A illustrates the timing drawing for the embodiment shown in FIG. 4.

Figure 5:
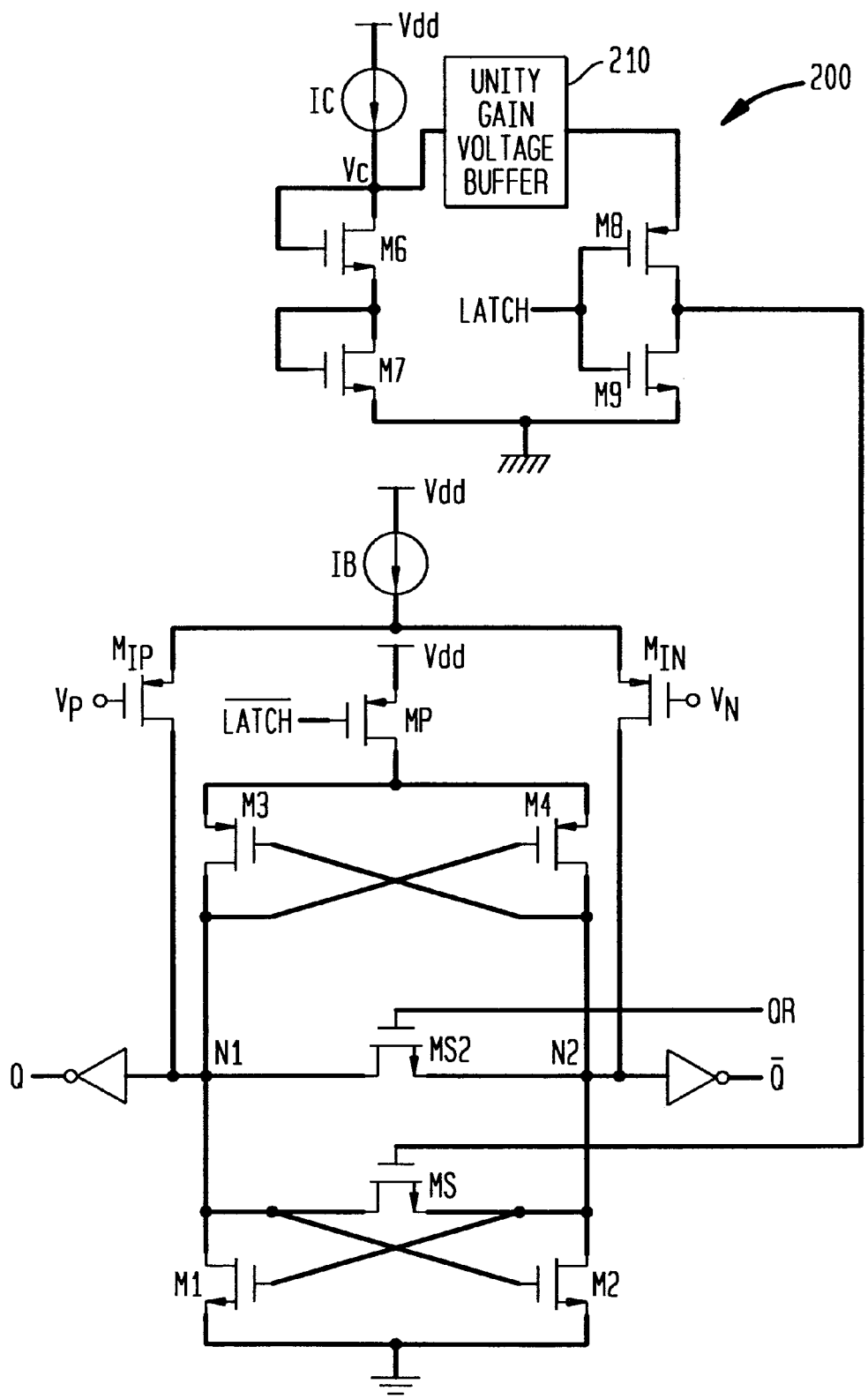
FIG. 5 is a circuit diagram of a second embodiment of the present invention.

In a preferred embodiment, the reset/sense phase is broken into two distinct phases using two different devices (e.g., transistors) as shown in FIG. 5. An additional device MS2 is added in parallel with device MS and sized such that the conductance of MS2 is large enough so that when it is turned on, it resets the circuit quickly. MS is sized based on obtaining a large gain, and MS2 is sized based on obtaining fast reset. This allows for more flexibility over the previous embodiment. The fast reset time can be made to be a small fraction of the time allocated for the sensing operation.

Figure 5A:
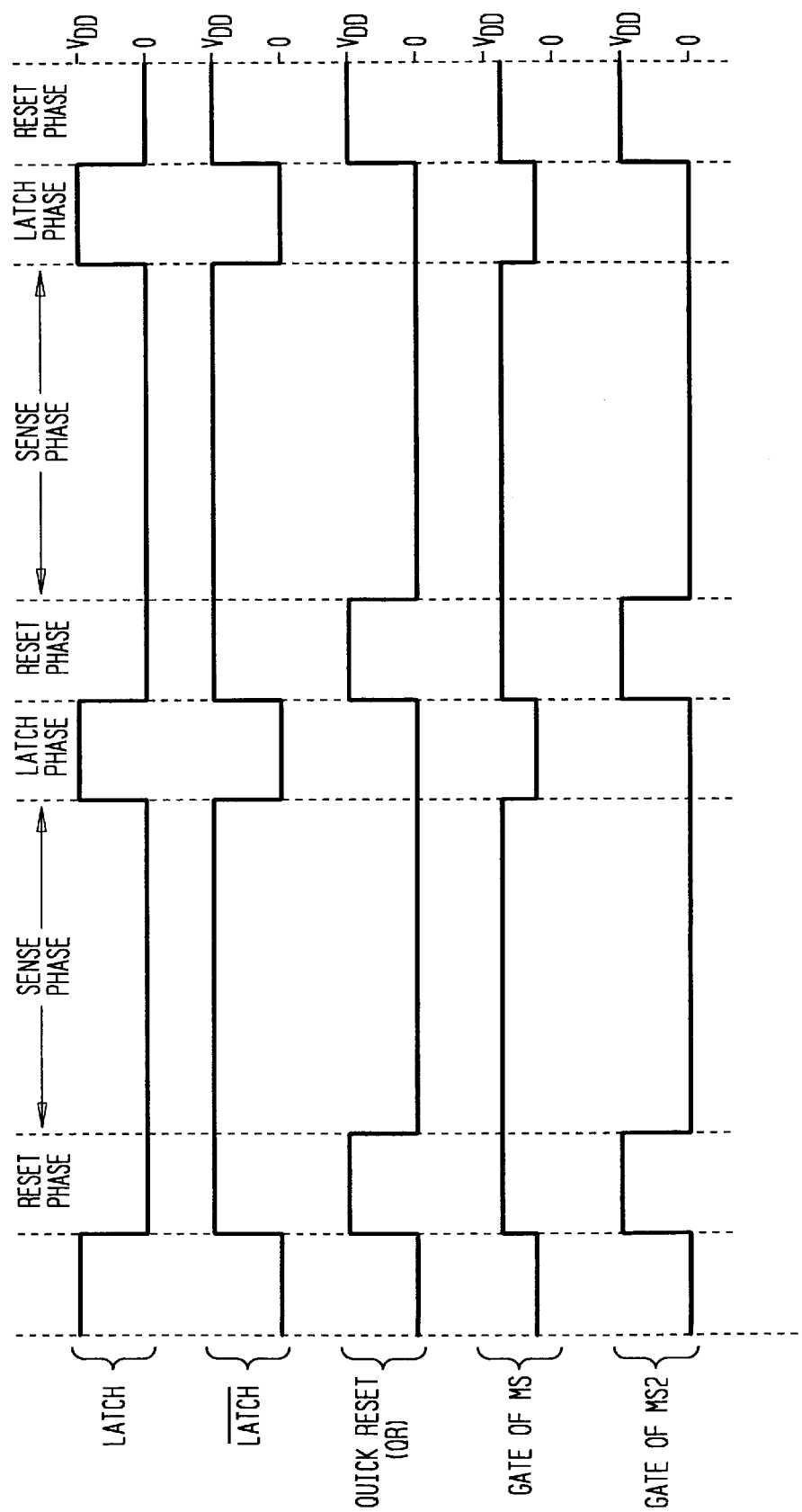
FIG. 5A is a timing drawing for the embodiment shown in FIG. 5.

As shown in FIG. 5, the additional device MS2 is connected between nodes N1 and N2. The control terminal of device MS2 is tied to a quick-reset signal QR that activates the device only for the brief amount of time required to reset the circuit, which can be made to be only a fraction of the time required for the sensing operation. As shown in the timing drawing of FIG. 5A, the voltage pulse of the quick-reset signal QR occurs during the reset phase of the circuit. The quick-reset signal QR can be derived from a clocking source, e.g., the master clock, so that this quick-reset signal QR is delivered to the control terminal of device MS2 on a periodic basis, e.g. every 4 nanoseconds.

Thus, since both the time needed to reset the circuit and the completeness of the reset are largely determined by device MS2, device MS can be optimally sized and controlled based on the gain requirement of the circuit. Large gain in this circuit results when the load conductance formed substantially by the combination of M1, M2, and MS is close to zero but positive. For example, to achieve large gain, device MS may be selected so that twice the conductance of device MS is slightly larger than the transconductance of M1 or M2. Thus, the differential load conductance (which is substantially equal to the difference between the conductance of MS and one-half the transconductance of M1 or M2) is small and positive. This is achieved by selecting proper W/L ratios for MS, M1, and M2 and generating a controlled control-terminal voltage for MS. To achieve this controlled control-terminal voltage, a circuit such as that shown in FIG. 5 can be used.

The transconductance of an N-channel MOS device in saturation is ideally given by:

$$g_m = K(W/L)(V_{GS}-V_T) = 2I_{DS}/(V_{GS}-V_T)$$

where $g_m$ is the transconductance, K is the process constant, $V_T$ is the threshold voltage of an MOS device, W is the effective channel width of an MOS device, L is the effective channel length of an MOS device, and $I_{DS}$ is the drain-to-source current of an MOS device.

The conductance between the drain and source of an N-channel MOS device in the triode region is ideally given by:

$$g_{ds} = K(W/L)(V_{GS}-V_T).$$

where $g_{ds}$ is the output conductance of an MOS device in the triode region. Thus, for a fully balanced electrical situation, if current source IC is one half of current source IB and devices M6, M7, M1, and M2 are all sized to have equal width-to-length ratios then all of these devices will have the same transconductance and the same value of $V_{GS}-V_T$. Since the source and drain voltages of MS are equal and are at one $V_{gs}$ above ground, applying a voltage of 2 $V_{GS}$ to the gate of MS would result in a $V_{GS}$ appearing between the gate and source of MS, and MS would be operating in the triode region. If MS were sized the same as M6, M7, M1, and M2, then it would have a conductance equal to the transconductance of these devices. Thus, for example, making the channel length of MS slightly less than twice that of M1 and M2, results in a small but positive net conductance by M1, M2, and MS (assuming identical channel widths for M1, M2, M6, M7, and MS), achieving a large gain. Should the operating currents and device sizes of M6, M7, M1 and M2 be different than given in this example, the equations above can be used to obtain an optimal sizing of MS in view of the different parameters.

Although the previous discussion ignores backgate effect and other non-ideal characteristics, it is understood that one of ordinary skill in the art is aware of these non-ideal characteristics and can accomplish the design goals set forth herein with the non-ideal effects being considered.

As shown in FIG. 5, a latch control-voltage generator 200 for device MS applies a control voltage to the control terminal of device MS. The latch control-voltage generator 200 comprises a pair of diode-connected transistors M6 and M7, and a set of series connected transistors M8 and M9 coupled to the control terminal of device MS. A unity gain voltage buffer 210 is configured with $V_C$ as its input. The unity gain buffer's output is connected to the source of transistor M8 as shown. Accordingly, if LATCH is low, a buffered version of control voltage $V_C$ is transferred to the control terminal of MS, because M8 acts like a closed switch and M9 acts like an open switch. If LATCH is high, M8 acts like an open switch and M9 acts like a closed switch; therefore the ground voltage is transferred to the control terminal of MS.

The resetting of the circuit is accomplished by applying a voltage pulse to the control terminal of device MS2 during the reset phase.

The invention disclosed herein results in the construction of a faster sense amp/latch circuit. A circuit so constructed is particularly desirable in high-speed A/D converters such as, for example, Flash A/D converters.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

We claim:

1. A sense amplifier/regenerative latch having a reset phase and a sensing phase separate from said reset phase, comprising:

impedance control means for switching a load impedance of said sense amplifier/regenerative latch to a first level during said reset phase and to a second level during said sensing phase.

2. A sense amplifier/regenerative latch as set forth in claim 1, wherein said impedance control means comprises:

first and second devices for controlling the switching of said sense amplifier/regenerative latch between said reset phase and said sensing phase.

3. A sense amplifier/regenerative latch as set forth in claim 2, wherein said first and said second devices comprise first and second transistors, respectively.

4. A sense amplifier/regenerative latch as set forth in claim 3, wherein said first transistor is connected to control the gain of said sense amplifier/regenerative latch during said sensing phase.

5. A sense amplifier/regenerative latch as set forth in claim 3, wherein said second transistor is connected to receive a reset pulse at its control terminal, thereby setting the load impedance of said sense amp/regenerative latch to said first level.

6. A sense amplifier/regenerative latch as set forth in claim 1, wherein said impedance control means comprises:

a device for controlling the switching of said sense amplifier/regenerative latch between said reset phase and said sensing phase.

7. A sense amplifier/regenerative latch as set forth in claim 6, wherein said device includes a control terminal and wherein a first voltage is applied to said control terminal during said reset phase, and wherein a second voltage which achieves less conductance for said device is applied to said control terminal during said sensing phase.

8. A sense amplifier/regenerative latch as set forth in claim 7, wherein said device comprises a transistor.

9. A method of optimizing the reset-speed and gain of a sense amplifier/regenerative latch having a reset phase and a sensing phase, comprising the steps of:

switching a load impedance of said sense amplifier/regenerative latch to a first level during said reset phase and to a second level during said sensing phase.

10. The method as set forth in claim 9, further comprising the step of selectively controlling the gain of said sense amplifier/regenerative latch during said sensing phase.

11. The method as set forth in claim 9, wherein said switching step further comprises controlling the switching of said load impedance between said first level and said second level using first and second transistors.

12. The method as set forth in claim 11, wherein said first transistor is connected to control the gain of said sense amplifier/regenerative latch during said sensing phase.

13. The method as set forth in claim 12, wherein said second transistor is connected to receive a reset pulse at its control terminal, thereby setting the load impedance of said sense amplifier/regenerative latch to said first level.

14. An integrated circuit including a sense amplifier/regenerative latch having a reset phase and a sensing phase separate from said reset phase, comprising:

impedance control means for switching a load impedance of said sense amplifier/regenerative latch to a first level during said reset phase and to a second level during said sensing phase.

15. An integrated circuit as set forth in claim 14, wherein said impedance control means comprises:

first and second devices for controlling the switching of said sense amplifier/regenerative latch between said reset phase and said sensing phase.

16. A sense amplifier/regenerative latch as set forth in claim 15, wherein said first and said second devices comprise first and second transistors, respectively.

17. An integrated circuit as set forth in claim 16, wherein said first transistor is connected to control the gain of said sense amplifier/regenerative latch during said sensing phase.

18. An integrated circuit as set forth in claim 16, wherein said second transistor is connected to receive a reset pulse at its control terminal, thereby setting the load impedance of said sense amp/regenerative latch to said first level.

19. An integrated circuit as set forth in claim 14, wherein said impedance control means comprises:

a device for controlling the switching of said sense amplifier/regenerative latch between said reset phase and said sensing phase.

20. An integrated circuit as set forth in claim 19, wherein said device includes a control terminal and wherein a first voltage is applied to said control terminal during said reset phase, and wherein a second voltage which achieves less conductance for said device is applied to said control terminal during said sensing phase.

* * * * *